United States Patent [19]

Aizawa

[11] Patent Number: 5,796,767

[45] Date of Patent: Aug. 18, 1998

[54] DRIVER CIRCUIT OF LIGHT-EMITTING DEVICE

[75] Inventor: Yukio Aizawa, Tokyo, Japan

[73] Assignee: NEC Corporation, Tokyo, Japan

[21] Appl. No.: 803,370

[22] Filed: Feb. 20, 1997

[30] Foreign Application Priority Data

Feb. 20, 1996 [JP] Japan ............................... 8-032216

[51] Int. Cl.$^6$ ............................................. H01S 3/00
[52] U.S. Cl. ............................................. 372/38
[58] Field of Search .................. 372/25, 38; 315/209 R, 315/209 T, 219, 225

[56] References Cited

PUBLICATIONS

R. Coppoolse et al., "Burst Mode Bipolar . . . to Point Passive Optical Network at 155.52 Mbit/s", 1995 Digest of the LEOS Summer Topical Meetings, Aug. 7–11, 1995, pp. 14–15.

Gray et al., Analysis and Design of Analog Integrated Circuits, Third Edition, John Wiley & Sons, Inc., 1993, pp. 279–283 No month.

Primary Examiner—Rodney B. Bovernick
Assistant Examiner—Robert E. Wise
Attorney, Agent, or Firm—Sughrue, Mion, Zinn, Macpeak & Seas, PLLC

[57] ABSTRACT

A driver circuit of a light-emitting device that is able to reduce the current consumption. This circuit includes a reference current source for generating a reference current, a cascode current source circuit for generating a driving current for the light-emitting device with the use of the reference current, and an input circuit for switching the driving current according to a data signal. The cascode current source circuit has a first current mirror formed by first and second transistors and a second current mirror formed by third and fourth transistors. The first transistor is supplied with a first constant current proportional to the reference current, and controls the second transistor so that the driving current flows through the second transistor. The third transistor is supplied with a second constant current proportional to the reference current, and generates a mirror current with respect to the second constant current. The second mirror current flows through the second transistor as the driving current. The input circuit serves to turn on and off the fourth transistor according to the data signal, thereby controlling the output of the driving current to the light-emitting device.

10 Claims, 10 Drawing Sheets $$\frac{\Delta I_{out}}{\Delta V_{out}} = \lambda$$

5,796,767

1

DRIVER CIRCUIT OF LIGHT-EMITTING DEVICE

BACKGROUND OF THE INVENTION

1. Field of the Invention

The present invention relates to a driver circuit of a light-emitting device such as a Light-Emitting Diode (LED) or a Laser Diode (LD) and more particularly, to a driver circuit of a light-emitting device applicable to a burst-mode optical communication system for subscribers which requires low voltage operation, low power consumption, and low cost fabrication.

2. Description of the Prior Art

FIG. 1 is a circuit diagram of a conventional driver circuit of a light-emitting device of this sort, in which Metal-Oxide-Semiconductor (MOS) transistors are used and to be realized on a semiconductor integrated circuit (IC).

In FIG. 1, the conventional driver circuit is used for driving a laser diode LD100. This circuit includes a pair of input terminals 100 and 101, and a differential input circuit 102 to be applied with a digital data signal for driving the laser diode LD100, a current source circuit 105 for supplying a constant current $I_{101}$ as a driving current to the laser diode LD100 through the differential input circuit 102, and a current source circuit 106 for supplying a constant current $I_{102}$ as a dc bias current to the laser diode LD100.

The differential input circuit 102 is formed by n-channel MOS transistors Q101 and Q102 whose sources are coupled together, i.e., by a source-coupled pair of MOS transistors Q101 and Q102. The digital data signal is applied across the non-inverted input terminal 100 and the inverted input terminal 101. The terminal 100 is connected to a gate of the MOS transistor Q102. The terminal 101 is connected to a gate of the MOS transistor Q101.

A drain of the transistor Q101 is connected to one end of a load resistor R101. The other end of the resistor R101 is applied with a power supply voltage $V_{DD}$.

A drain of the transistor Q102, which serves as an output terminal of the conventional driver circuit, is connected to the cathode of the laser diode LD100. The anode of the laser diode LD100 is applied with the power supply voltage $V_{DD}$.

The current source circuit 105 is formed by n-channel MOS transistors Q103 and Q104 serving as a current mirror, and a reference current source 103 for supplying a constant reference current $I_{ref1}$ to the transistor Q104. The current mirror has a mirror ratio of $m_{101}$.

A drain of the transistor Q103 is connected to the coupled sources of the transistors Q101 and Q102. A source of the transistor Q103 is connected to the ground. A drain and a gate of the transistor Q104 is connected in common to a gate of the transistor Q103. A source of the transistor Q104 is connected to the ground. The commonly-connected drain and gate of the transistor Q104 is connected to one end of the reference current source 103. The other end of the reference current source 103 is applied with the power supply voltage $V_{DD}$.

The current source circuit 106 is formed by n-channel MOS transistors Q105 and Q106 serving as a current mirror, and a reference current source 104 for supplying a constant reference current $I_{ref2}$ to the transistor Q106. The current mirror has a mirror ratio of $m_{102}$.

A drain of the transistor Q105 is connected to the drain of the cathode of the laser diode LD100, i.e., the output terminal of the conventional driver circuit of FIG. 1. A source of the transistor Q105 is connected to the ground. A

2 drain and a gate of the transistor Q106 is connected in common to a gate of the transistor Q105. A source of the transistor Q106 is connected to the ground. The commonly-connected drain and gate of the transistor Q106 is connected to one end of the reference current source 104. The other end of the reference current source 104 is applied with the power supply voltage $V_{DD}$.

The operation of the conventional driver circuit of FIG. 1 is as follows:

The transistors Q103 and Q104 in the current source circuit 105 constitute the current mirror with the mirror ratio $m_{101}$ and as a result, the transistor Q103 generates the mirror current $I_{101}$, which is equal to $m_{101}$ times as much as the constant reference current $I_{ref1}$, i.e., $(m_{101} \cdot I_{ref1})$.

Similarly, the transistors Q105 and Q106 in the current source circuit 106 constitute the current mirror with the mirror ratio $m_{102}$ and as a result, the transistor Q105 generates the mirror current $I_{102}$, which is equal to $m_{102}$ times as much as the reference current $I_{ref2}$, i.e., $(m_{102} \cdot I_{ref2})$.

The constant bias current $I_{102}$ is set as a value lower than the threshold current of the laser diode LD100 in order not to actually drive the diode LD100 for light emission. The constant driving current $I_{101}$ is set as a value at which the laser diode LD100 is actually driven by the sum of the currents $I_{101}$ and $I_{102}$, i.e., $(I_{101}+I_{102})$.

When the digital data signal is inputted across the input terminals 100 and 101 so that the terminal 100 is in a high level "H" and the terminal 101 is in a low level "L", the transistor Q102 is turned ON and the transistor Q101 is turned OFF. At this time, the sum current $(I_{101}+I_{102})$ flows through the laser diode LD100 and the transistor Q102, thereby actually driving the diode LD100. Thus, specific light is emitted from the LD100.

Contrarily, when the digital data signal is inputted across the pair of input terminals 100 and 101 so that the terminal 100 is in a low level "L" and the terminal 101 is in a high level "H", the transistor Q102 is turned OFF and the transistor Q101 is turned ON. At this time, only the driving current $I_{101}$ flows through the resistor R101 and the transistor Q101 and simultaneously, only the bias current $I_{102}$ flows through the laser diode LD100. No current flows through the transistor Q102. Thus, no light is emitted from the LD100.

With the above-described conventional driver circuit of FIG. 1 has the following problems:

Specifically, a first problem is that the current consumption of the circuit of FIG. 1 is large, because the dc bias current $I_{102}$ is always consumed during operation independent upon the existence and absence of light emission and because the driving current $I_{101}$ is consumed even when no light is emitted from the laser diode LD100. This problem becomes eminent for a burst-mode optical transmitter where the light-emitting period is very short with respect to the no light-emitting period.

A second problem is that the optical output from the laser diode LD100 tends to contain some overshoot during the high-speed switching operation. This is caused by the use of the analog switch formed by the transistor Q102.

Specifically, since the MOS transistor Q102 is used for switching the driving current $I_{101}$, a spike voltage tends to occur during the high-speed switching operation at the output terminal of the driver circuit of FIG. 1, i.e., at the connection point of the cathode of the diode LD100 and the drain of the transistor Q102. The spike voltage is due to the gate-drain parasitic capacitance of the transistor Q102.

3

A third problem is that the available range of the driving current $I_{101}$ for linear control is narrow under the condition that the laser diode LD100 is driven by the current $I_{101}$ while keeping the mirror ratio $m_{101}$ at a fixed value with respect to the reference current $I_{ref1}$. This means that the conventional driver circuit of FIG. 1 is not cope with light-emitting device having various current-light conversion characteristics. This problem is caused by the following fact:

Specifically, the current mirror formed by the transistors Q103 and Q104 is able to be rewritten to an equivalent circuit as shown in FIG. 2, where the transistor Q102 is operating in the non-saturation (i.e., the triode region) for the purpose of high-speed switching operation. In FIG. 2, $I_{out}$ denotes an output current of the current mirror formed by the transistors Q103 and Q104, where $I_{out}=I_{101}$, and $V_{out}$ denotes an output voltage thereof.

The equivalent circuit of FIG. 2 has the $I_{out}-V_{out}$ characteristic as shown in FIG. 3. This $I_{out}-V_{out}$ characteristic is obtained by the fact that the small signal output impedance of this equivalent circuit is approximately determined by only the self conductance of the transistor Q103. In other words, this $I_{out}-V_{out}$ characteristic is due to the fact that the small signal output impedance of this equivalent circuit is approximately determined by $(1/g_{ds})$, where $g_{ds}$ is the self conductance of the transistor Q103.

In FIG. 3, the region B1 is the non-saturation or triode region of the transistor Q103 and the region B2 is the saturation region thereof. λ is the output conductance of this current mirror, where $\lambda=I_{out}/V_{out}$.

It is seen from FIG. 3 that the output current $I_{out}$ varies dependent upon the output voltage $V_{out}$ in the saturation region B2. This variation of $I_{out}$ will be especially large in the case of miniaturized MOS transistors, because the miniaturized MOS transistors typically have a large output conductance λ. For this reason, the driving current $I_{101}$ is readily affected by the output voltage $V_{out}$ of the conventional driver circuit of FIG. 1 (i.e., by the drain voltage of the transistor Q102).

As a result, to keep the mirror ratio $m_{101}$ at a fixed value with respect to the reference current $I_{ref1}$, the available range of the driving current $I_{101}$ needs to be narrow.

A fourth problem is that the conventional driver circuit of FIG. 1 is readily affected by the variation of the external impedance, because the conventional driver circuit of FIG. 1 has a low output impedance. This leads to the restriction for mounting condition of the laser diode LD100 and its relating components.

SUMMARY OF THE INVENTION

Accordingly, an object of the present invention is to provide a driver circuit of a light-emitting device that is able to reduce the current consumption.

Another object of the present invention is to provide a driver circuit of a light-emitting device that is able to solve the problem relating to the optical output waveform.

Still another object of the present invention is to provide a driver circuit of a light-emitting device that is able to cope with light-emitting devices having various current-light conversion characteristics.

A further object of the present invention is to provide a driver circuit of a light-emitting device that is able to relax the mounting restriction for a light-emitting device and its relating components, thereby enabling the realization of the driver circuit at a low fabrication cost.

A driver circuit of a light-emitting device according to the present invention includes a reference current source for generating a reference current, a cascode current source circuit for generating a driving current for the light-emitting device with the use of the reference current, and an input circuit for switching the driving current according to a data signal.

The cascode current source circuit has a first current mirror formed by first and second transistors and a second current mirror formed by third and fourth transistors.

The first transistor of the first current mirror is supplied with a first constant current proportional to the reference current, and controls the second transistor of the first current mirror so that the driving current flows through the second transistor.

The third transistor of the second current mirror is supplied with a second constant current proportional to the reference current, and generates a mirror current with respect to the second constant current. The second mirror current flows through the second transistor as the driving current.

The input circuit serves to turn the fourth transistor on and off according to the data signal, thereby controlling the output of the driving current to the light-emitting device.

With the driver circuit of a light-emitting device according to the present invention, first, the driving current for the light-emitting device is realized by the mirror current generated by the second current mirror of the cascode current source circuit. The output of the driving current thus realized is controlled by turning on or off the fourth transistor of the second current mirror of the cascode current source circuit with the use of the input circuit.

Therefore, no bias current is necessary for the light-emitting device. Also, the driving current is not supplied to the light-emitting device when no light is emitted from the light-emitting device. As a result, the current consumption is able to be reduced.

Second, since the output of the driving current is controlled by turning on or off the fourth transistor of the second current mirror with the use of the input circuit, no analog switch is used therefor. Accordingly, the problem relating to the optical output waveform is able to be solved.

Third, because the cascode current source circuit is used for the purpose of generating the driving current, the output current (i.e., the driving current) of the driver circuit according to the present invention may have almost no dependence upon the output voltage change at the output terminal of this driver circuit. Accordingly, the available range of the driving current can be expanded.

This means that the driver circuit according to the present invention is able to cope with light-emitting devices having various current-light conversion characteristics.

Fourth, because the cascode current source circuit is provided for the purpose of generating the driving current, the output impedance of the driver circuit according to the present invention is high. Therefore, the driver circuit according to the present invention is difficult to be affected by the change of the external impedance.

As a result, the driver circuit according to the present invention can relax the mounting-condition restriction for a light-emitting device and its relating components. This leads to a low fabrication cost.

In a preferred embodiment of the circuit according to the present invention, the first transistor of the first current mirror is supplied with the first constant current through a transistor, and the third transistor of the second current mirror is supplied with the second constant current through another transistor.

In this case, an additional advantage that the driving current generated by the first current mirror is not affected by the turn-on and turn-off of the fourth transistor of the second current mirror which is caused by the input circuit.

In another preferred embodiment of the circuit according to the present invention, the first transistor of the first current mirror is supplied with the first constant current through a transistor, and the third transistor of the second current mirror is supplied with the second constant current through the same transistor.

In this case, there arises an additional advantage that the circuit configuration is simple.

In still another preferred embodiment of the circuit according to the present invention, the input circuit includes a timing circuit and fifth and sixth transistors.

The fifth transistor serves as a switch for turning on or off the control of the fourth transistor of the second current mirror by the third transistor of the second current mirror. The fifth transistor is driven by a first timing signal from the timing circuit.

The sixth transistor serves as a switch for turning on or off the fourth transistor of the second current mirror. The sixth transistor is driven by a second timing signal from the timing circuit.

The first and second timing signals preferably have a time delay, because some problem will take place if the fifth and sixth transistors are simultaneously turn on or off.

In a further preferred embodiment of the circuit according to the present invention, the timing circuit of the input circuit includes cascaded inverters. The first timing signal is derived from an output of the inverters, and the second timing signal is derived from another output of the inverters.

Each of the first to sixth transistors may be a Field-Effect Transistor (FET) such as a MOS transistor, or a gallium arsenide (GaAs) FET, a bipolar transistor, or the like, if it is capable of the corresponding function as above.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
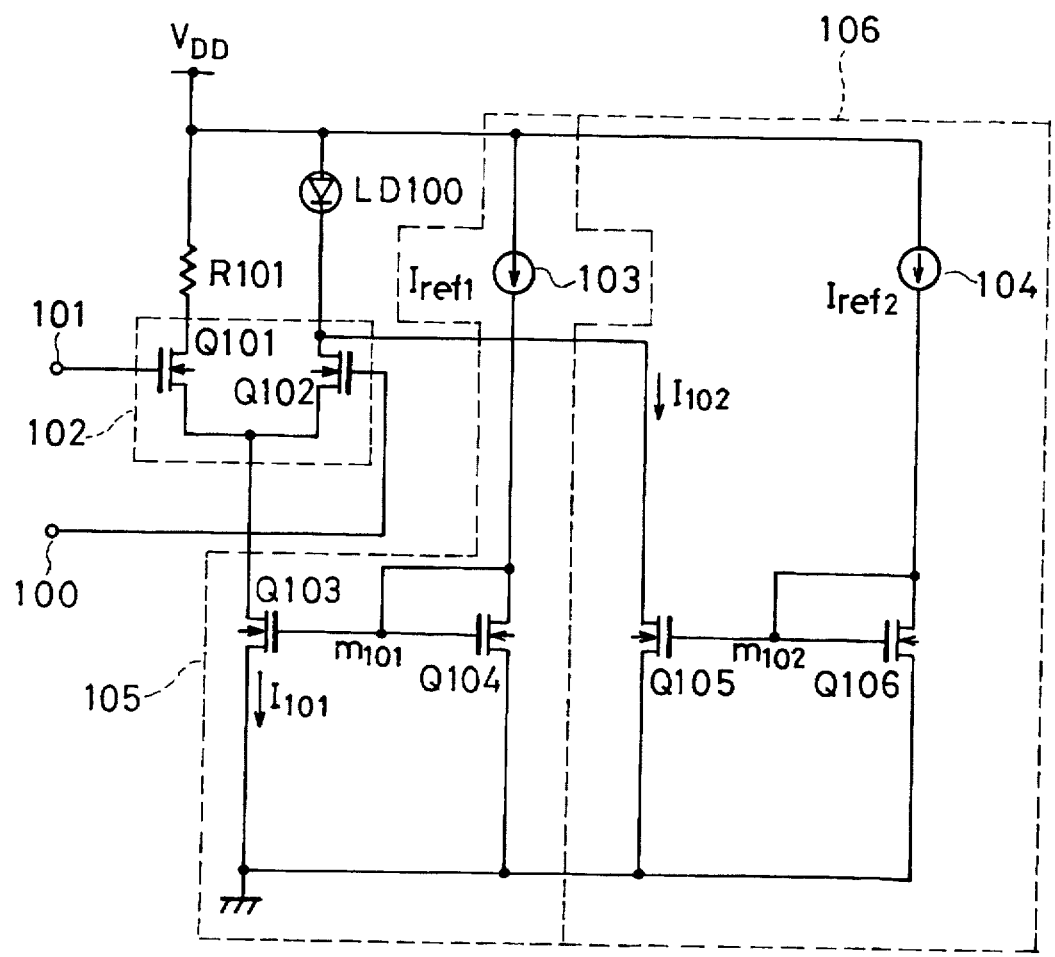
FIG. 1 is a circuit diagram of a conventional driver circuit of a light-emitting device.

Preferred embodiments of the present invention will be described below referring to the drawings attached.

FIRST EMBODIMENT

Figure 4:
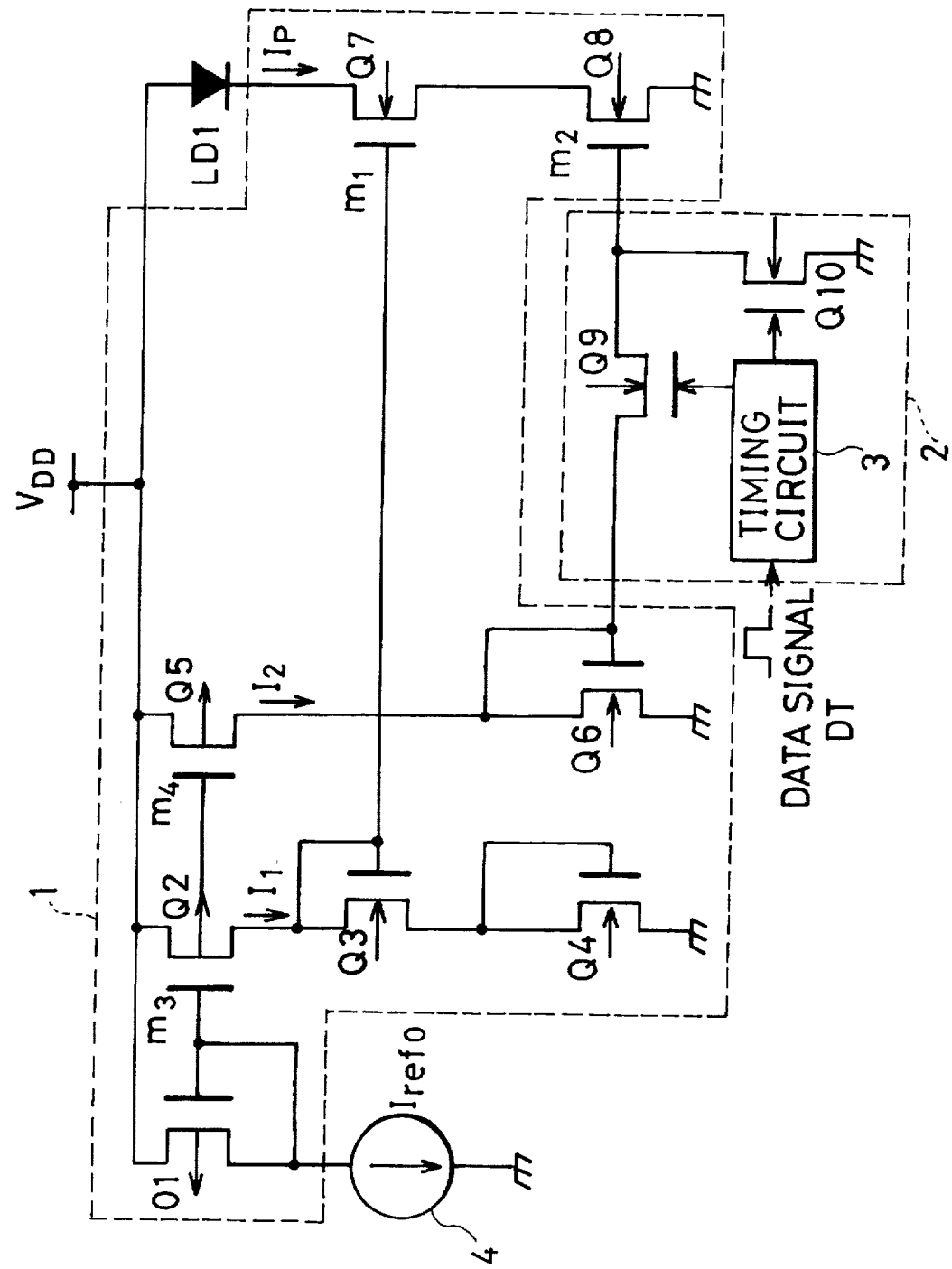
FIG. 4 is a circuit diagram of a driver circuit of a light-emitting device according to a first embodiment of the present invention.

A driver circuit of a light-emitting device according to a first embodiment is shown in FIG. 4, in which MOS transistors are used and to be realized on a semiconductor IC.

In FIG. 4, the driver circuit according to the first embodiment is used for driving a laser diode LD1. This circuit includes a reference current source 4 for generating a constant reference current $I_{ref0}$, a cascode current source circuit 1 for generating a driving current $I_p$ for the laser diode LD1, and an input circuit 2 for switching the driving current $I_p$ on or off according to a digital data signal DT.

The cascode current source circuit 1 has two n-channel MOS transistors Q3 and Q7 in a first stage, and three n-channel MOS transistors Q4, Q6 and Q8 in a second stage. The transistors Q3 and Q7 in the first stage constitute a first current mirror with a first mirror ratio $m_1$. The transistors Q6 and Q8 in the second stage constitute a second current mirror with a second mirror ratio $m_2$.

The cascode current source circuit 1 further has three p-channel MOS transistors Q1, Q2, and Q5. The transistors Q1 and Q2 serve as a third current mirror with a mirror ratio $m_3$. The transistors Q1 and Q5 serve as a fourth current mirror with a mirror ratio $m_4$.

Figure 5:
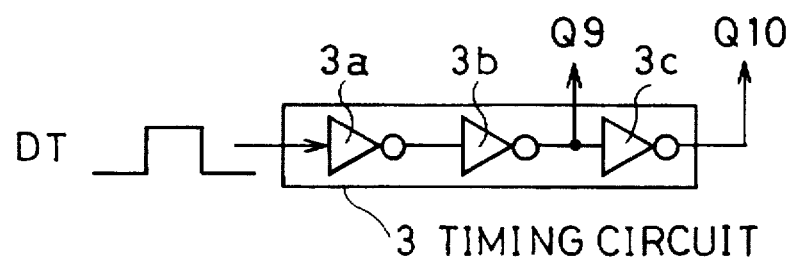
FIG. 5 is a circuit diagram of the timing circuit of the input circuit in the driver circuit according to the first embodiment of FIG. 4.

The input circuit 2 has a timing circuit 3, and two n-channel MOS transistors Q9 and Q10. The timing circuit 3 has a configuration as shown in FIG. 5, in which first, second, and third inverters 3a, 3b, and 3c are connected in cascade. A gate of the transistor Q9 is applied with an output signal from the second inverter 3b. A gate of the transistor Q10 is applied with an output signal from the third inverter 3c, i.e., an output signal of the timing circuit 3. Thus, the gates of the transistors Q9 and Q10 are applied with the corresponding output signals at different timings.

Figure 6:
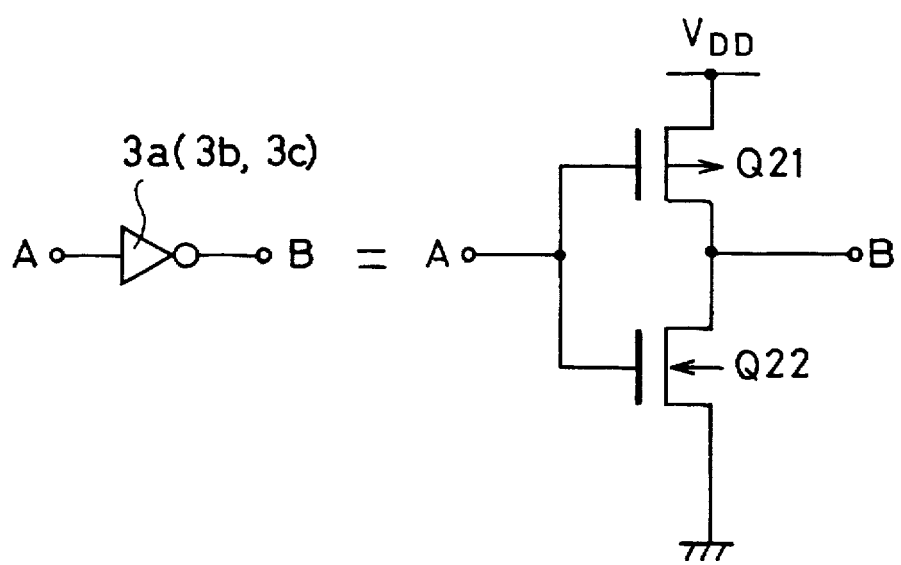
FIG. 6 is a circuit diagram of the inverter of the timing circuit in the driver circuit according to the first embodiment of FIG. 4.

Each of the first, second, and third inverters 3a, 3b, and 3c has the same configuration as shown in FIG. 6. As shown in FIG. 6, for example, each of the inverters 3a, 3b, and 3c has the so-called CMOS configuration, in which a p-channel MOS transistor Q21 and an n-channel MOS transistor Q22 are connected in series between the power supply voltage $V_{DD}$ and the ground.

Specifically, a source of the transistor Q21 is applied with the power supply voltage $V_{DD}$. A drain of the transistor Q21 is connected to a drain of the transistor Q22. A source of the transistor Q22 is connected to the ground. Gates of the transistors Q21 and Q22 are connected in common to an input terminal A of the inverter. Drains of the transistors Q21 and Q22 are connected in common to an output terminal B of the inverter.

Further, a gate and a drain of the transistor Q1 is connected in common to one end of the constant current source 4. The other end of the source 4 is connected to the ground. A source of the transistor Q1 is applied with the power supply voltage $V_{DD}$.

A gate of the transistor Q2 is connected to the gate of the transistor Q1. A source of the transistor Q2 is applied with the power supply voltage $V_{DD}$. A drain of the transistor Q2 is connected to a drain of the transistor Q3.

A gate of the transistor Q5 is connected to the gate of the transistor Q1. A source of the transistor Q5 is applied with the power supply voltage $V_{DD}$. A drain of the transistor Q5 is connected to a drain of the transistor Q6.

The drain and a gate of the transistor Q3 are connected in common to a gate of the transistor Q7. A source of the transistor Q3 is connected to a drain of the transistor Q4.

The drain and a gate of the transistor Q4 are coupled together. A source of the transistor Q4 is connected to the ground.

The drain and a gate of the transistor Q6 are connected in common to a drain of the transistor Q9. A source of the transistor Q6 is connected to the ground.

A drain of the transistor Q7 is connected to the cathode of the laser diode LD1. The anode of the diode LD1 is applied with the power supply voltage $V_{DD}$. A source of the transistor Q7 is connected to a drain of the transistor Q8.

A gate of the transistor Q8 is connected to a source of the transistor Q9 and a drain of the transistor Q10. A source of the transistor Q10 is connected to the ground.

A gate of the transistor Q9 is connected to the timing circuit 3, in other words, to the output terminal of the second inverter 3b of the timing circuit 3. A gate of the transistor Q10 also is connected to the timing circuit 3, in other words, to the output terminal of the third inverter 3c of the timing circuit 3.

The third current mirror formed by the transistors Q1 and Q2 supplies a mirror current $I_1$ to the transistors Q3 and Q4. Since the third current mirror has the mirror ratio of $m_3$, the mirror current $I_1$ is equal to $m_3$ times as much as the reference current $I_{ref0}$, i.e., $I_1 = m_3 \cdot I_{ref0}$.

The fourth current mirror formed by the transistors Q1 and Q5 supplies a mirror current $I_2$ to the transistor Q6. Since the fourth current mirror has the mirror ratio of $m_4$, the mirror current $I_2$ is equal to $m_1$ times as much as the reference current $I_{ref0}$, i.e., $I_2 = m_4 \cdot I_{ref0}$.

In the first current mirror formed by the transistors Q3 and Q7, the current $I_1$ flowing through the transistor Q3 serves as its reference current. Because the gates of the transistors Q3 and Q7 are coupled together, the voltages at the gates of the transistors Q3 and Q7 are equal to each other, thereby turning the transistor Q7 on. Therefore it is said that the first current mirror has a function of allowing the driving current $I_p$ to flow through the transistor Q7.

In the second current mirror formed by the transistors Q6 and Q8, the current $I_2$ flowing through the transistor Q6 serves as its reference current and therefore, a mirror current, i.e., the driving current $I_p$ flows through the transistor Q8 under the condition that the transistor Q9 is in the ON state. Since the second current mirror has the mirror ratio of $m_2$, the mirror or driving current $I_p$ is equal to $m_2$ times as much as the current $I_2$, i.e., $I_p = m_2 \cdot I_2$.

The transistor Q9 in the input circuit 2 serves as a switch for connecting or separating the gates of the transistors Q6 and Q8 of the second current mirror. The transistor Q10 serves as a switch for changing the gate voltage of the transistor Q8 between the ground and the gate voltage of the transistor Q6, thereby switching on and off the transistor Q8 and consequently the driving current $I_p$.

In other words, to output the driving current $I_p$ to the diode LD1 according to the digital data signal DT, the transistors Q9 and Q10 are alternately turned on or off by the input circuit 2.

The diode-connected transistor Q4 serves to adjust the gate voltage of the transistors Q3 and Q7 of the first current mirror.

Next, the operation of the driver circuit according to the first embodiment will be explained below with reference to FIGS. 7A to 7E.

Figure 7A:
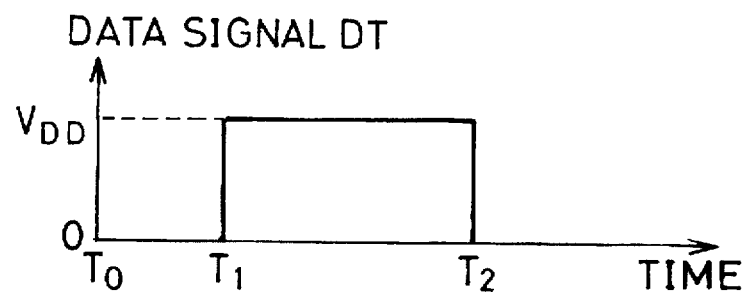
FIG. 7A is a timing chart of the data signal used in the driver circuit according to the first embodiment of FIG. 4.
Figure 7B:
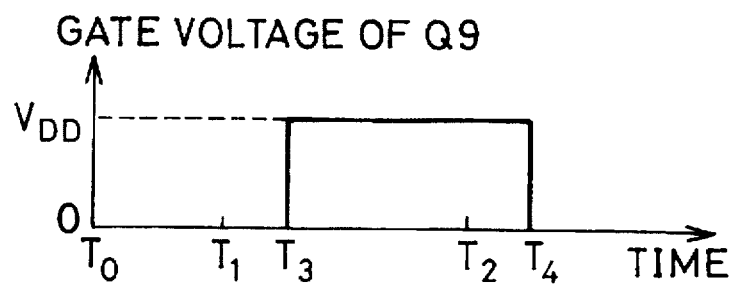
FIG. 7B is a timing chart of the gate voltage of the transistor Q9 in the driver circuit according to the first embodiment of FIG. 4.

Here, it is supposed that the digital data signal DT has a pulse shown in FIG. 7A, in which the signal DT is in a low level "L" (voltage=0) between the times $T_0$ and $T_1$, and is in a high level "H" (voltage=$V_{DD}$) between the times $T_1$ and $T_2$.

Between the times $T_0$ and $T_1$, since the data signal DT is in the low level "L", the gate of the transistor Q9 is applied with the signal in the low level "L" from the timing circuit 3 of the input circuit 2. The gate of the transistor Q10 is applied with the signal in the high level "H" from the timing circuit 3 thereof. As a result, the transistor Q9 is in the "OFF" state, and the transistor Q10 is in the "ON" state.

Thus, the gates of the transistors Q6 and Q8 are separated from each other, and the gate of the transistor Q8 is connected to the ground. Therefore, the transistor Q8 is in the "OFF" state and the driving current $I_p$ is not supplied to the laser diode LD1 through the transistor Q7. This means that no light is emitted from the laser diode LD1.

At the time $T_1$, the data signal DT is turned to the high level "H" ($V_{DD}$). Then, the gate of the transistor Q9 is applied with the signal in the high level "H" ($V_{DD}$) from the timing circuit 3 of the input circuit 2 at the time $T_3$. The gate of the transistor Q10 is applied with the signal in the low level "L" (0) from the timing circuit 3 thereof at the time $T_5$. As a result, the transistor Q9 is turned "ON", and the transistor Q10 is turned "OFF".

Thus, the gate of the transistor Q8 is connected to the gate of the transistor Q6 and is separated from the ground. Then, the gate of the transistor Q8 is applied with the gate voltage $V(I_p)$ and consequently, the transistor Q8 is turned "ON". As a result, the driving current $I_p$ flows through the transistor Q7 and the laser diode LD1, thereby emitting the light from the diode LD1 at the optical output power $K(I_p)$ at the time $T_7$.

Due to the action of the timing circuit 2, the gate voltage of the transistor Q9 is changed after a time delay of ($T_3 - T_1$), and the gate voltage of the transistor Q10 is changed after a time delay of $(T_5-T_1)$, where the delay of $(T_5-T_1)$ is longer than that of $(T_3-T_1)$. The light emission is started after a time delay of $(T_7-T_1)$.

When the pulse of the data signal DT is changed to the low level "L" (0) at the time $T_2$, the gate of the transistor Q9 is applied with the signal in the low level "L" from the timing circuit 3. The gate of the transistor Q10 is applied with the signal in the high level "H" from the timing circuit 3. As a result, the transistor Q9 is turned to the "OFF" state, and the transistor Q10 is turned to the "ON" state.

Thus, the gates of the transistors Q6 and Q8 are separated from each other, and the gate of the transistor Q8 is connected to the ground, thereby turning the transistor Q8 to the "OFF" state. Accordingly, the driving current $I_p$ and therefore the emission of the light is stopped at the time $T_8$.

Due to the action of the timing circuit 2, the gate voltage of the transistor Q9 is changed after a time delay of $(T_4-T_2)$, and the gate voltage of the transistor Q10 is changed after a time delay of $(T_6-T_2)$, where the delay of $(T_6-T_2)$ is longer than that of $(T_4-T_2)$. The light emission is stopped after a time delay of $(T_8-T_2)$.

Figure 7C:
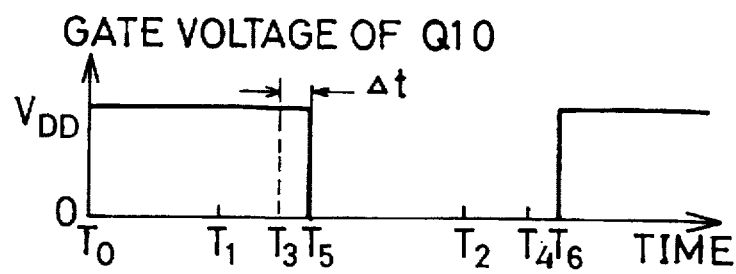
FIG. 7C is a timing chart of the gate voltage of the transistor Q10 in the driver circuit according to the first embodiment of FIG. 4.
Figure 7D:
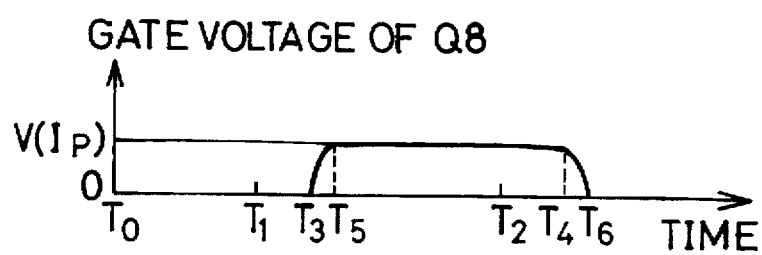
FIG. 7D is a timing chart of the gate voltage of the transistor Q8 in the driver circuit according to the first embodiment of FIG. 4.
Figure 7E:
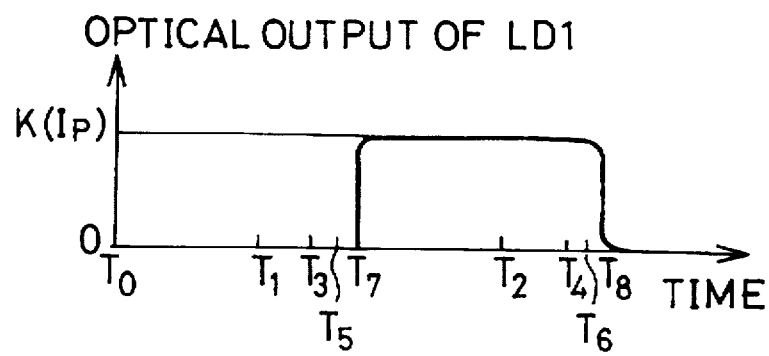
FIG. 7E is a timing chart of the optical output power of the laser diode driven by the driver circuit according to the first embodiment of FIG. 4.

As seen from FIG. 7C, both of the transistors Q9 and Q10 are in the "ON" state between the times $T_3$ and $T_5$, i.e., within the time period $\Delta t$ |=$(T_5-T_3)$|. In this case, the gate voltage of the transistor Q8 is not equal to the gate voltage of the transistor Q6 and as a result, a problem that the driving current $I_p$ does not have a specific, wanted value will occur.

However, this problem is able to be substantially solved by satisfying the following relationship $$9\left(\frac{L9}{W9}\right) \leq \left(\frac{L10}{W10}\right) \tag{1}$$

where L9 and W9 are the gate length and the gate width of the transistor Q9, and L10 and W10 are the gate length and the gate width of the transistor Q10, respectively. The reason is as follows:

When the ON resistances of the transistors Q9 and Q10 are defined as $R9_{ON}$ and $R10_{ON}$, and the gate voltages of the transistors Q6 and Q8 are defined as $V6_g$ and $V8_g$, respectively, the following equation (2) is established.

$$V6_g \times \left(\frac{R10_{ON}}{R9_{ON}+R10_{ON}}\right) = V8_g \tag{2}$$

Here, to keep the gate voltage $V8_g$ of the transistor Q8 equal to or higher than the 90% of the gate voltage $V6_g$ of the transistor Q6, in other words, to satisfy the following relationship (3), the following relationship (4) needs to be satisfied.

$$0.9 \times V6_g \leq V8_g \tag{3}$$

$$\left(\frac{R10_{ON}}{R9_{ON}+R10_{ON}}\right) \geq 0.9 \tag{4}$$

The relationship (4) is rewritten to the following expression (5) as $$\left(\frac{R9_{ON}}{R10_{ON}}\right) \geq 9 \tag{5}$$

Typically, the ON resistance of a MOS transistor is proportional to a ratio of the gate length L to the gate width W, i.e., (L/W). Therefore, the following relationships (6) and (7) are established.

$$R9_{ON} \propto \frac{L9}{W9} \tag{6}$$

$$R10_{ON} \propto \frac{L10}{W10} \tag{7}$$

If these relationships (6) and (7) are used, the above expression (5) is able to further rewritten to the above-described expression (1).

The relationship (3) is selected because no problem will occur in the practical use even if both of the transistors Q9 and Q10 are in the "ON" state between the time period $\Delta t$.

The driving current $I_p$ of the laser diode LD1 is expressed as follows $$I_p = \left(\frac{W8}{L8}\right) \times C_{ox8} \times \mu \times (V(IP) - V_{th})^2 \times (1 + \lambda V_{ds8}) \tag{8}$$

where W8 and L8 are the gate width and the gate length, $C_{ox8}$ is the gate oxide capacitance per unit area, $\mu$ is the carrier mobility, $V_{th}$ is the threshold voltage, $\lambda$ is the self conductance, $V_{ds8}$ is the source-to-drain voltage of the transistor Q8, respectively.

The mirror ratio $m_1$ is defined as a ratio of (W7/L7)/(W3/L3), i.e., $m_1$=(W7/L7)/(W3/L3), where W7 and L7 are the gate width and the gate length of the transistor Q7, and W3 and L3 are the gate width and the gate length of the transistor Q3, respectively.

The mirror ratio $m_2$ is defined as a ratio of (W8/L8)/(W6/L6), i.e., $m_2$=(W8/L8)/(W6/L6), where W8 and L8 are the gate width and the gate length of the transistor Q8, and W6 and L6 are the gate width and the gate length of the transistor Q6, respectively.

The mirror ratio $m_3$ is defined as a ratio of (W2/L2)/(W1/L1), i.e., $m_1$=(W2/L2)/(W1/L1), where W1 and L1 are the gate width and the gate length of the transistor Q1, and W2 and L2 are the gate width and the gate length of the transistor Q2, respectively.

The mirror ratio $m_4$ is defined as a ratio of (W5/L5)/(W1/L1), i.e., $m_4$=(W5/L5)/(W1/L1), where W5 and L5 are the gate width and the gate length of the transistor Q5, respectively.

The mirror ratio affects the accuracy of the linearity of the driving current $I_p$. Therefore, the accuracy of the mirror ratio will be described below.

To cope with light-emitting devices having various current-light conversion characteristics, the driver circuit needs to have a wide available range of the driving current $I_p$ in which the laser diode LD1 can be linearly controlled. This requires the small dependence of the mirror ratio of each current mirror upon the driving current $I_p$ in the cascode circuit 1. Thus, the dependence of the mirror ratio will be explained below.

Figure 8:
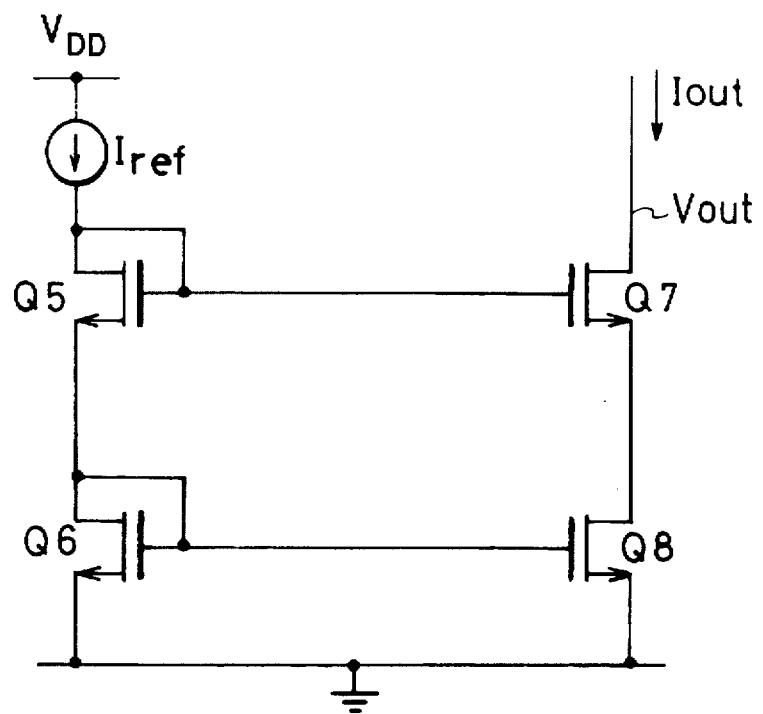
FIG. 8 is an equivalent circuit diagram of the cascode current source circuit in the driver circuit according to the first embodiment of FIG. 4.
Figure 9:
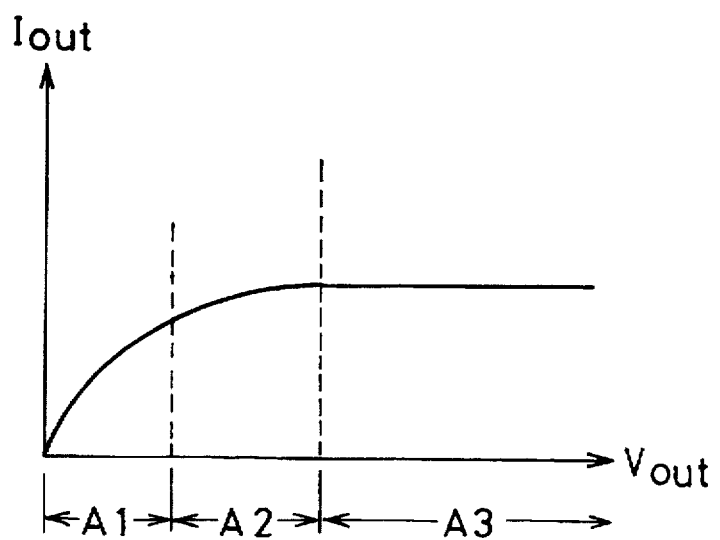
FIG. 9 is an I-V characteristic of the equivalent circuit of FIG. 8.

The cascode current source circuit 1 can be expressed as an equivalent circuit as shown in FIG. 8 when the transistor Q9, is ON and the transistor Q10 is OFF. FIG. 9 shows the I-V characteristic of the equivalent circuit of FIG. 8.

Figure 2:
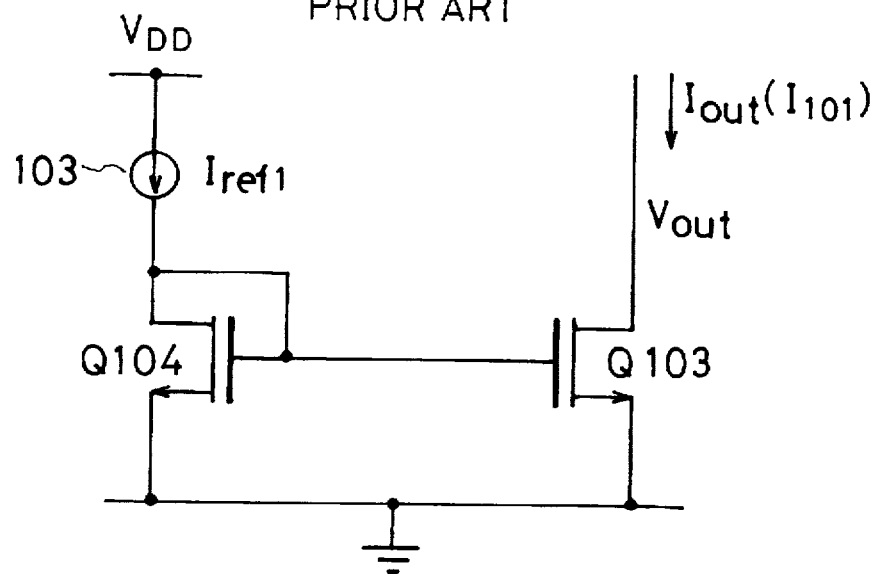
FIG. 2 is an equivalent circuit diagram of the current mirror formed by the MOS transistors Q103 and Q104 in the conventional driver circuit of FIG. 1.
Figure 3:
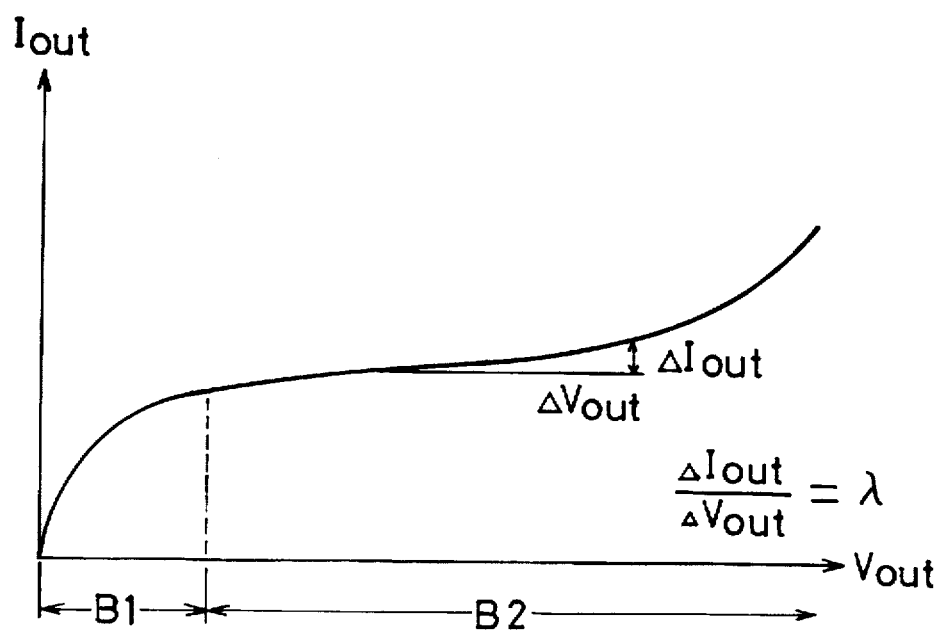
FIG. 3 is a graph showing an I-V characteristic of the equivalent circuit of FIG. 2.

With the previously-described conventional equivalent circuit of FIG. 2, the small signal output resistance of this circuit is determined by $(1/g_{ds})$, where $g_{ds}$ is the self conductance of the transistor Q103. As a result, this circuit has the I-V characteristic as shown in FIG. 3.

However, with the equivalent circuit of FIG. 8 of the cascode current source circuit 1 according to the first embodiment, the small signal output resistance of this circuit is determined by $$\frac{\left(1+\frac{g_{m2}}{g_{ds1}}\right)}{g_{ds2}} + \frac{1}{g_{ds1}} \tag{9}$$

where $g_{ds1}$ and $g_{ds2}$ are the self conductance of the transistors Q8 and Q7, and $g_{m1}$ and $g_{m2}$ are the mutual conductance of the transistors Q8 and Q7, respectively.

Generally, when a MOS transistor is operating in the saturation region, the self conductance is in the order of $10^{-5}$ and the mutual conductance is in the order of $10^{-3}$. Therefore, the small signal output resistance is in the order or $10^5$ in the conventional equivalent circuit of FIG. 2. On the other hand, the small signal output resistance is in the order or $10^7$ in the equivalent circuit of FIG. 8 according to the first embodiment.

This means that the small signal output resistance of FIG. 8 according to the first embodiment is approximately 100 times as much as that of the conventional circuit of FIG. 2.

Further, in the cascode circuit of FIG. 8, the gate-drain parasitic capacitance (i.e., the Miller capacitance) of the transistor Q8 is low, resulting in the good high-frequency characteristics. Therefore, both of the transistors Q7 and Q8 are able to operate in the saturation region, which corresponds to the region A3 in FIG. 9. The I–V characteristic is approximately flat in the region A3.

The output conductance obtained by the I–V characteristic in FIG. 9 is approximately (1/100) times as much as that of the I–V characteristic in FIG. 3.

In the region A2 of FIG. 9, only the transistor Q8 is operating in the saturation region, and the transistor Q7 is operating in the non-saturation or triode region. In the region A1 of FIG. 9, both of the transistors Q7 and Q8 are operating in the non-saturation or triode region.

In the cascode circuit of FIG. 8, because of its large small-signal output resistance, the mirror ratio of each current mirror is kept almost unchanged, even if the output or driving current $I_{out}$ is changed and as consequently, the output voltage $V_{out}$ (i.e., the operating point) varies. This means that the mirror ratio has a small dependence upon the output voltage $V_{out}$ and the driving current $I_{out}$ or $I_p$. The driving current $I_{out}$ or $I_p$ is approximately determined only by the gate voltage of the transistor Q8.

Thus, the driver circuit according to the first embodiment is able to cope with light-emitting devices having various current-light conversion characteristics.

The above consideration about the cascode circuit of FIGS. 8 and 9 is disclosed in the book entitled "Analysis and Design of Analog Integrated Circuits", third edition, pp 279–283, written by Paul R. Gray and Robert G. Meyer, published in 1993 by John Wiley & Sons, Inc.

For the spike voltage, which is caused by the gate-drain parasitic capacitance of the transistor Q8 on its switching operation, the power supply that sets the gate voltage of the transistor Q7 through the gate-source parasitic capacitance of the transistor Q7 absorbs such the spike voltage. Therefore, the problem about the optical output waveform is not caused by the spike voltage.

Next, the resistance of the driver circuit according to the first embodiment against the external impedance change will be shown below with reference to FIGS. 10 and 11.

Figure 10:
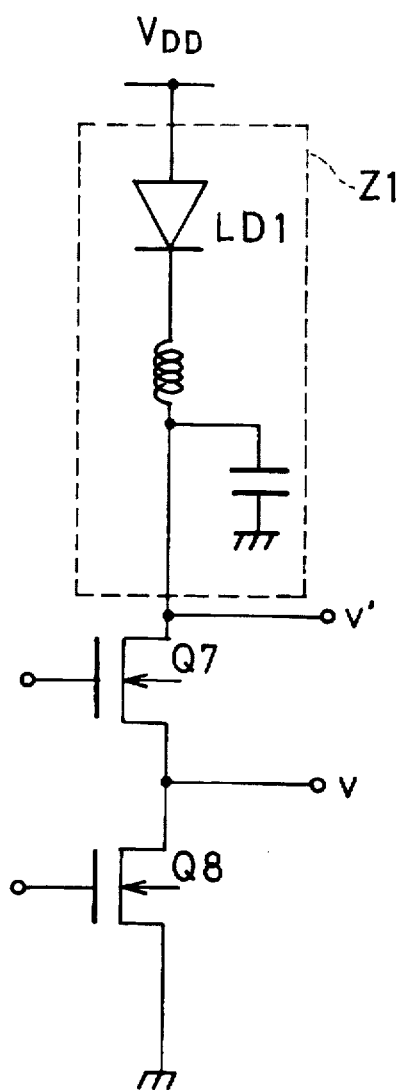
FIG. 10 is an equivalent circuit diagram of the output stage of the driver circuit according to the first embodiment of FIG. 4.
Figure 11:
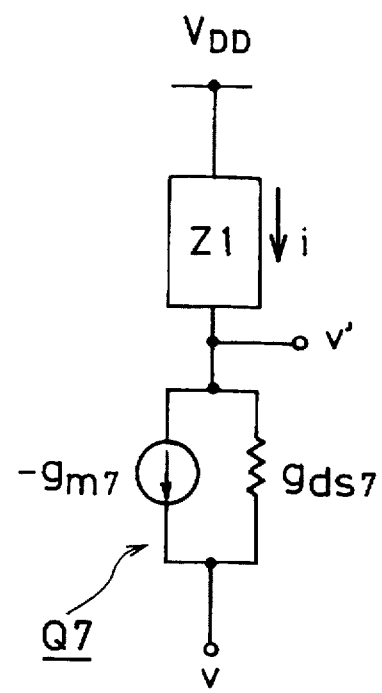
FIG. 11 is a small signal equivalent circuit of the output stage of the driver circuit according to the first embodiment of FIG. 4.

FIG. 10 is an equivalent circuit diagram of the output stage of the driver circuit according to the first embodiment of FIG. 4, and FIG. 11 is a small signal equivalent circuit thereof, in which Z1 denotes the external impedance of this driver circuit, $g_{m7}$ and $g_{ds7}$ are the mutual conductance and the self conductance of the transistor Q7, respectively, v is a source voltage of the transistor Q7, and v' is the drain voltage of the transistor Q7.

From FIG. 11, the following equation is obtained.

$$\frac{v'}{Z1} - g_{m7} + g_{ds7}(v'-v) = 0 \tag{10}$$

A current i flowing through the external impedance Z1 is expressed as $$i = \frac{v'}{Z1} \tag{11}$$

Here, the output impedance of the driver circuit according to the first embodiment with respect to the source of the transistor Q7, i.e., the combination of the external impedance Z1 and the impedance of transistor Q7, is defined as $Z_{OUT}$. Then, $Z_{OUT}$ is expressed as follows:

$$Z_{OUT} = \frac{v}{i} = \frac{1 + g_{ds7} \cdot Z1}{G_{m7} + g_{ds7}} \tag{12}$$

Here, $g_{m7} \cong 10^{-3}$ and $g_{ds7} \cong 10^{-5}$, and therefore, the equation (12) can be approximated to the following:

$$Z_{OUT} = \frac{1 + g_{ds7} \cdot Z1}{g_{m7}} \tag{13}$$

From the equation (13), it is seen that the variation of the external impedance Z1 is suppressed due to the self conductance of the transistor Q7 by a factor of $g_{ds7}$ ($=10^{-5}$) with respect to the impedance $Z_{OUT}$.

Accordingly, the external terminal, i.e., the connection point of the transistor Q7 and the laser diode LD1 is difficult to be affected by the change of the external impedance Z1. Thus, (a) the jitter, which are generated by the fact that the driver circuit drives the diode LD1 with no bias current, (b) the ringing due to the parasitic inductance, (c) the waveform deformation due to the parasitic capacitance are all able to be suppressed. This leads to relaxation of the device mounting condition and to reduction of the fabrication cost.

As described above, with the driver circuit of a light-emitting device according to the first embodiment, the driving current $I_p$ is realized by the first mirror current $I_1$ generated by the first current mirror of the cascode current source circuit 1. The supply or output of the driving current $I_p$ is controlled by turning on or off the transistor Q8 of the second current mirror of the cascode current source circuit 1 with the use of the input circuit 2.

Therefore, first, no bias current is necessary for the laser diode LD1. The driving current $I_p$ is not supplied to the diode LD1 when no light is emitted from the light-emitting device. As a result, the current consumption is able to be reduced.

Second, no analog switch is directly connected to the laser diode LD1 for turning on and off the driving current $I_p$ and accordingly, the problem relating to the optical output waveform is able to be solved.

Third, the cascade current source circuit 1 is provided for the purpose of generating the driving current $I_p$. Therefore, the output current $I_{OUT}$ of the driver circuit according to the present invention (i.e., the driving current $I_p$) has almost no dependence upon the change of the output voltage $V_{OUT}$ at the output terminal of the driver circuit. Accordingly, the available range of the driving current $I_p$ can be expanded. This means that the driver circuit according to the present invention is able to cope with light-emitting devices having various current-light conversion characteristics.

Fourth, because the cascade current source circuit 1 is provided for the purpose of generating the driving current $I_p$, the output impedance of the driver circuit according to the present invention is high. Therefore, this driver circuit is difficult to be affected by the change of the external impedance. As a result, this driver circuit can relax the mounting restriction for a light-emitting device and its relating components. This leads to a low fabrication cost.

SECOND EMBODIMENT

Figure 12:
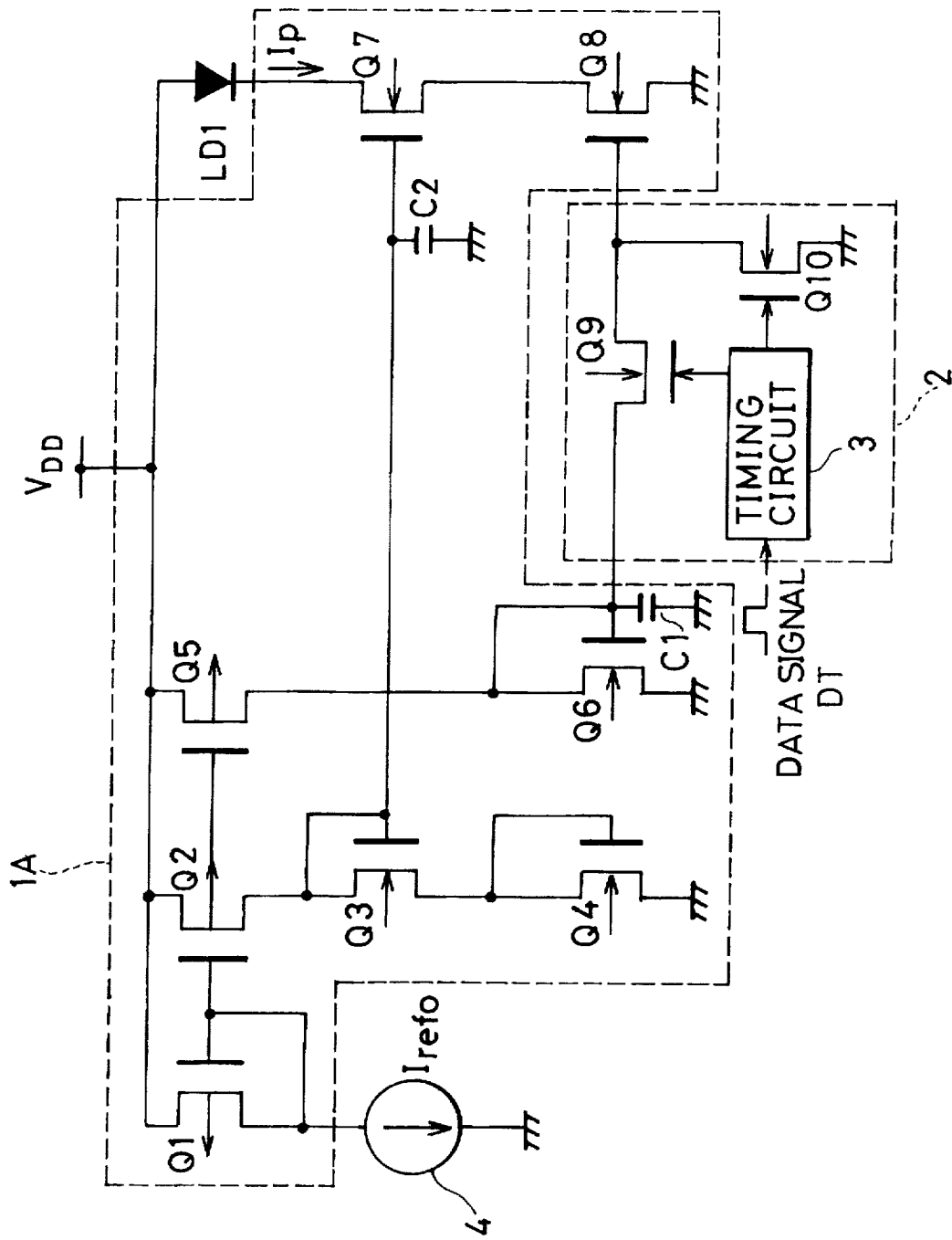
FIG. 12 is a circuit diagram of a driver circuit of a light-emitting device according to a second embodiment of the present invention.

FIG. 12 shows a driver circuit for driving a laser diode according to a second embodiment.

This circuit has the same configuration as that of the first embodiment except that a capacitor C1 is connected between the gate of the transistor Q6 and the ground and another capacitor C2 is connected between the gate of the transistor Q7 and the ground in a cascode current source 1A. Therefore, for the sake of simplification, the description about the same configuration is omitted here by adding the same reference characters to the corresponding elements in the second embodiment of FIG. 12.

In the driver circuit according to the second embodiment, there is an additional advantage that the fluctuation or deviation of the gate voltages of the transistors Q6 and Q7 can be suppressed on switching operation, in addition to the same advantages as those in the first embodiment.

THIRD EMBODIMENT

Figure 13:
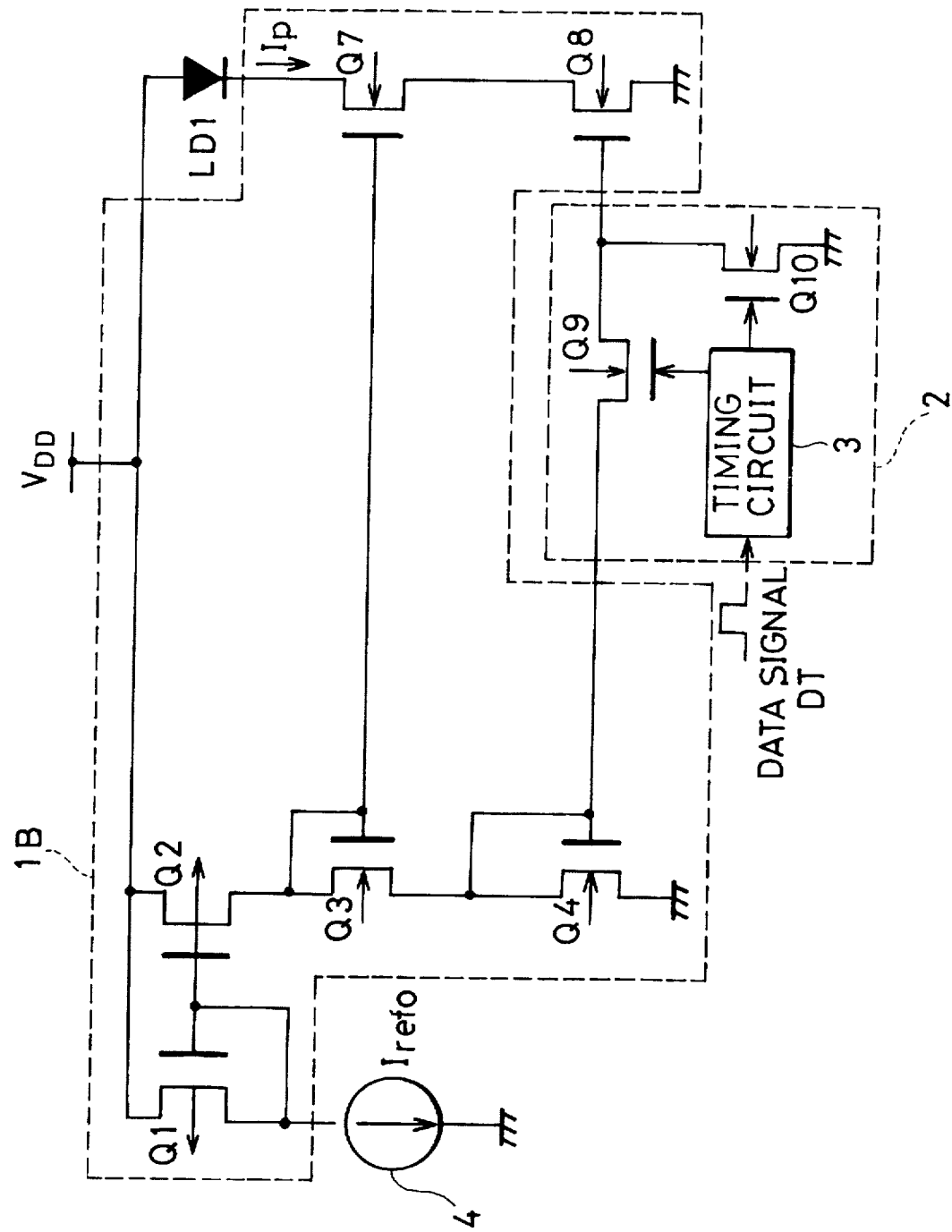
FIG. 13 is a circuit diagram of a driver circuit of a light-emitting device according to a third embodiment of the present invention.

FIG. 13 shows a driver circuit for driving a laser diode according to a third embodiment.

This circuit has the same configuration as that of the first embodiment except that the transistors Q5 and Q6 are omitted and that the gate of the transistor Q8 is connected to the gate of the transistor Q4 in a cascode current source 1B.

In the driver circuit according to the third embodiment, there is an additional advantage that the configuration of the cascode current source 1B is simpler than that of the first embodiment, in addition to the same advantages as those in the first embodiment.

FOURTH EMBODIMENT

Figure 14:
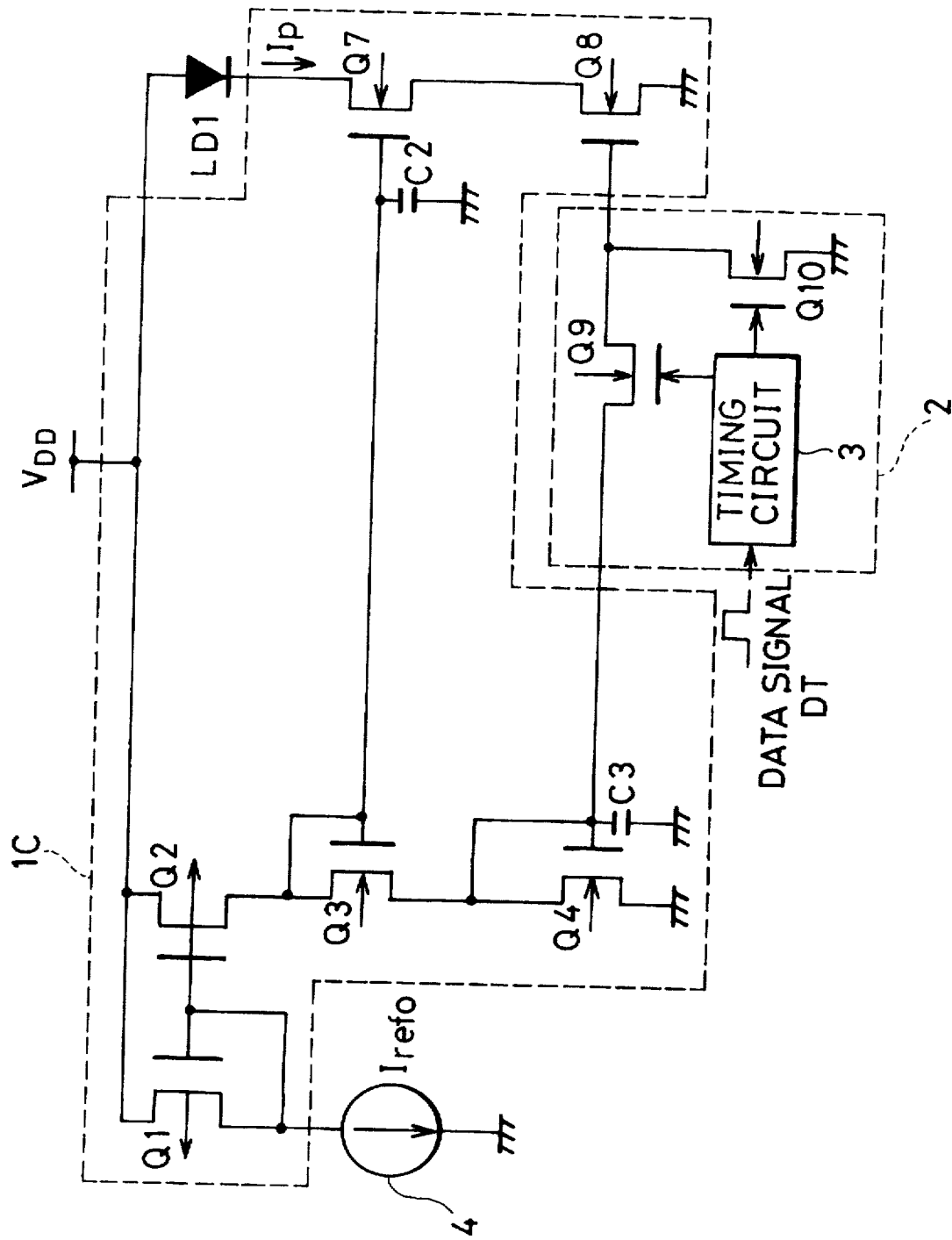
FIG. 14 is a circuit diagram of a driver circuit of a light-emitting device according to a fourth embodiment of the present invention

FIG. 14 shows a driver circuit for driving a laser diode according to a fourth embodiment.

This circuit has the same configuration as that of the third embodiment except that a capacitor C3 is connected between the gate of the transistor Q4 and the ground and another capacitor C2 is connected between the gate of the transistor Q7 and the ground in a cascode current source 1C.

In the driver circuit according to the fourth embodiment, there is an additional advantage that the fluctuation or deviation of the gate voltages of the transistors Q4 and Q7 can be suppressed on switching operation, and that the configuration of the cascode current source 1C is simpler than that of the first embodiment, in addition to the same advantages as those in the first embodiment.

MOS transistors are used in the above embodiments. However, bipolar transistors, or any other transistors such as GaAs FETs may be used in the present invention if they are able to realize the corresponding functions.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A driver circuit of a light-emitting device comprising:
   a reference current source for generating a reference current;
   a cascode current source circuit for generating a driving current for said light-emitting device with the use of said reference current;
   an input circuit for switching said driving current according to a data signal;
   said cascode current source circuit having a first current mirror formed by first and second transistors and a second current mirror formed by third and fourth transistors;
   said first transistor of said first current mirror being supplied with a first constant current proportional to said reference current, and controlling said second transistor so that said driving current flows through said second transistor;
   said third transistor of said second current mirror being supplied with a second constant current proportional to said reference current, and generating a mirror current with respect to said second constant current;
   said second mirror current flowing through said fourth transistor as said driving current;
   said input circuit serving to turn on and off said fourth transistor according to said data signal, thereby controlling said output of said driving current to said light-emitting device.

2. A circuit as claimed in claim 1, wherein said first transistor of said first current mirror is supplied with said first constant current through a transistor;
   and wherein said third transistor of said second current mirror is supplied with said second constant current through another transistor.

3. A circuit as claimed in claim 1, wherein said first transistor of said first current mirror is supplied with said first constant current through a transistor;
   and wherein said third transistor of said second current mirror is supplied with said second constant current through the same transistor as that of said first transistor.

4. A circuit as claimed in claim 1, wherein said input circuit includes a timing circuit and fifth and sixth transistors;
   and wherein said fifth transistor serves as a switch for turning on or off the control of said fourth transistor of said second current mirror by said third transistor of said second current mirror;
   and wherein said fifth transistor is driven by a first timing signal from said timing circuit;
   and wherein said sixth transistor serves as a switch for turning on or off said fourth transistor of said second current mirror;
   and wherein said sixth transistor is driven by a second timing signal from said timing circuit.

5. A circuit as claimed in claim 4, wherein said first and second timing signals have a time delay.

6. A circuit as claimed in claims 4, wherein said timing circuit of said input circuit includes cascaded inverters;
   and wherein said first timing signal is derived from an output of said inverters, and said second timing signal is derived from another output of said inverters.

7. A circuit as claimed in claim 4, wherein each of said first to sixth transistors is a MOS transistor;

and wherein said fifth MOS transistor of said input circuit has a gate length L5 and a gate width W5, and said sixth MOS transistor of said input circuit has a gate length L6 and a gate width W6;

and wherein L5, W5, L6, and W6 satisfy a relationship of $$9\left(\frac{L5}{W5}\right) \leq \left(\frac{L6}{W6}\right).$$

8. A circuit as claimed in claim 1, wherein each of said first to fourth transistors is a MOS transistor.

9. A circuit as claimed in claim 8, further comprising:

a first capacitor connected to a gate and a source of said second MOS transistor; and a second capacitor connected to a gate and a source of said third MOS transistor.

10. A circuit as claimed in claim 8, wherein said fifth MOS transistor of said input circuit has a gate applied with said first timing signal, and a drain and a source connected to respective gates of said third and fourth MOS transistors;

and wherein said sixth MOS transistor of said input circuit has a gate applied with said second timing signal, and a drain and a source connected between a gate and a source of said fourth MOS transistor.

* * * * *